United States Patent

[11] 3,581,166

[72] Inventor Takayuki Suzuoka
Kodaira-shi, Japan
[21] Appl. No. 792,992
[22] Filed Jan. 22, 1969
[45] Patented May 25, 1971
[73] Assignee Hitachi, Ltd.
Tokyo, Japan
[32] Priority Jan. 29, 1968
[33] Japan
[31] 43/5484

[54] GOLD-ALUMINUM LEADOUT STRUCTURE OF A SEMICONDUCTOR DEVICE
5 Claims, 16 Drawing Figs.

[52] U.S. Cl. .......... 317/235, 317/234
[51] Int. Cl. .......... H01l 5/02
[50] Field of Search .......... 317/101 (A), 234 (5.2) (5.3) (5.4)

[56] References Cited

UNITED STATES PATENTS

| | | | |
|---|---|---|---|
| 3,271,635 | 9/1966 | Wagner | 317/234 |
| 3,404,319 | 10/1968 | Tsuji et al. | 317/234 |

*Primary Examiner*—John W. Huckert
*Assistant Examiner*—W. Larkins
*Attorney*—Craig, Antonelli, Stewart and Hill

ABSTRACT: A semiconductor device, wherein a metal plate having first and second metal layers is fitted on one principal surface of an insulating substrate on which a plurality of leadout leads extend; a semiconductor substrate with a plurality of integrated circuit elements being fitted to said first metal layer; said second metal layer and the first lead being connected by a first connecting wire; and the electrodes of said circuit elements being connected to the remaining leads by the second connecting wires.

INVENTOR

TAKAYUKI SUZUOKA

BY Craig and Antonelli

ATTORNEYS

INVENTOR

TAKAYUKI SUZUOKA

BY Craig and Antonelli

ATTORNEYS

INVENTOR

TAKAYUKI SUZUOKA

BY Craig and Antonelli

ATTORNEYS

GOLD-ALUMINUM LEADOUT STRUCTURE OF A SEMICONDUCTOR DEVICE

This invention relates to an improvement on the electrode leadout structure of a semiconductor device.

The surface of a semiconductor element is sensitive to the external atmosphere, and usually covered with a special passivation film and/or accommodated in a special casing. For example, the semiconductor element is molded by a plastic material or sealed tightly in a vessel consisting of a stem and a cap connected thereto. In the present technology of semiconductor integrated circuit means in which a plurality of circuit elements are integrated to compose a functional circuit, the substrate is often accommodated in a flat package. On the surface of a semiconductor substrate many terminals or electrodes are prepared for the functional circuit. The package is provided with many leads extending from the inside to the outside and leading these electrodes out of the package.

When one or a plurality of circuit elements is to be formed in and/or on a semiconductor substrate, it is often necessary to prepare a terminal for giving a reference electric potential to the substrate. Further, when a certain kind of circuit means e.g. an amplifier circuit having bipolar transistors is included in the substrate, the heat generated in the circuit should be effectively radiated or dissipated.

The above-mentioned flat package has for its major constituent elements an insulating plate for mounting the semiconductor substrate and several leads and a cap for sealing both the substrate and the insulating plate. So, there is still room for further improvement in view of leading out the reference lead and promoting heat radiation, etc.

The electrodes on the semiconductor substrate are usually made of aluminum while the soldering of the substrate to the metal supporting plate is done by using gold. The connectors are made of aluminum or gold thin wire. The contact between gold and aluminum forms a hard and fragile alloy (the so-called purple plague or black plague), which produces unfavorable effects for the circuit element, e.g. unfavorable effects such as disconnection of the connector thin wire, separation of the electrode layer, and an increase in contact resistance at the contact portion.

Therefore, the object of this invention is to provide a novel terminal or electrode leadout structure.

Another object of this invention is to provide an improved electrode structure for a semiconductor integrated circuit means.

Still another object of this invention is to provide a method for fitting the semiconductor substrate with circuit elements on the insulating plate of a flat package in such a manner as to promote heat radiation from the substrate.

A further object of this invention is to provide an electrode lead out structure not subject to such a purple plague or black plague phenomenon as has been observed between gold and aluminum.

According to one embodiment of this invention in order to accomplish these objects, a metal supporting plate having a gold layer in one portion and an aluminum layer in another portion separated from the gold layer is employed. The semiconductor substrate is soldered to the gold layer. The metal plate and the substrate are fitted to an insulating supporting plate. The aluminum layer and external leadout electrode layer are connected by aluminum thin wire.

According to another embodiment, the substrate electrode, connecting wires, and solder material are all made of gold. The metal supporting plate on which the substrate is soldered is fixed by a glass layer in a prescribed cavity on the surface of an insulating support.

Other objects and features of this invention will be made more apparent from the following description of the preferred embodiments of this invention taken in conjunction with the accompanying drawings, in which.

Figure 1:
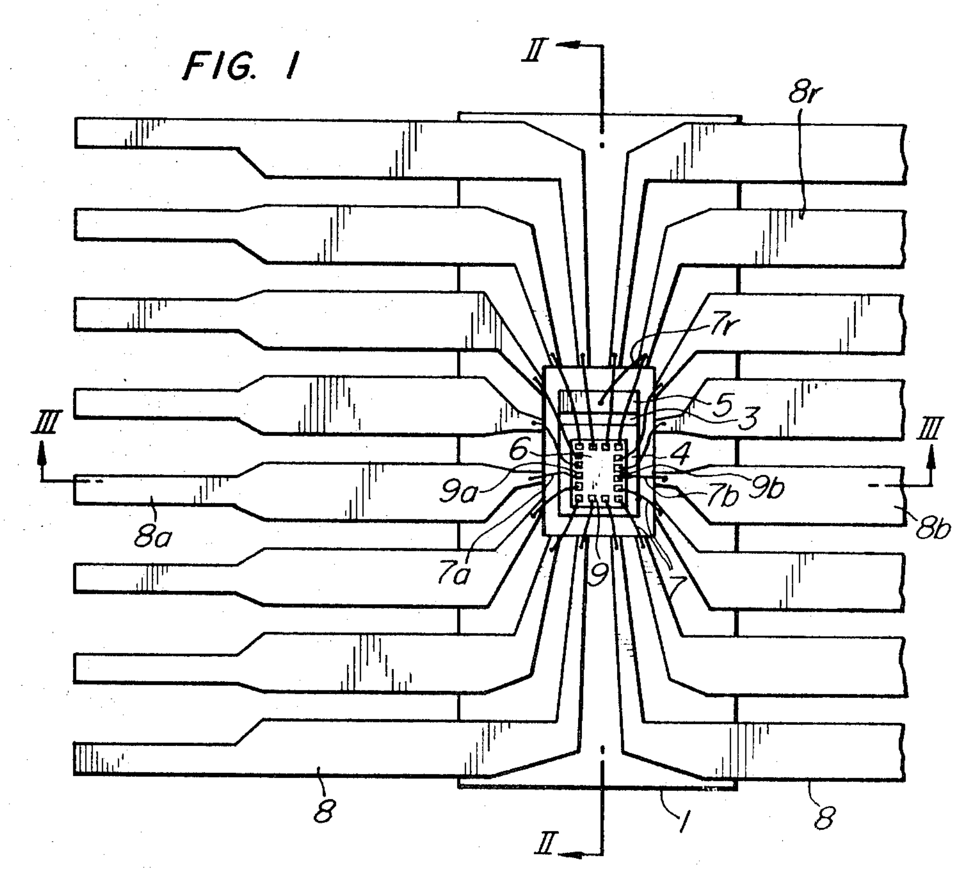
FIG. 1 is a top view of a semiconductor integrated circuit means according to one embodiment of this invention.

FIGS. *4a* to *4g* are cross-sectional views showing the regular sequence of manufacturing steps for a metal plate used in the circuit in FIG. 1.

FIGS. *5a* to *5c* are cross-sectional views showing a modification of the manufacturing method shown in FIGS. *4a* to *4c*.

Figure 6:
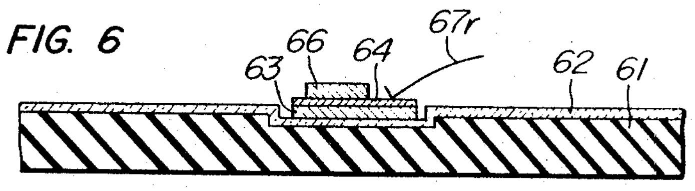

FIG. 6 is a cross-sectional view of the electrode leadout structure according to another embodiment of this invention.

Figure 7:
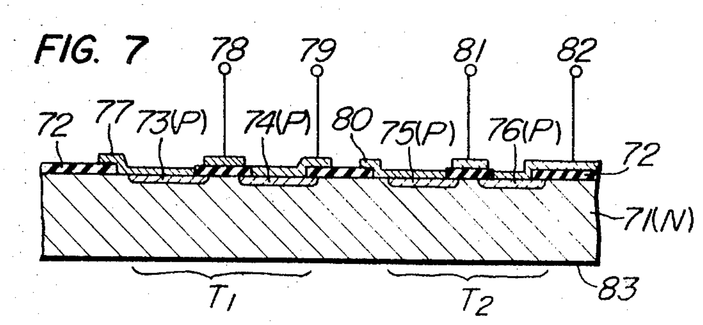
Figure 8:
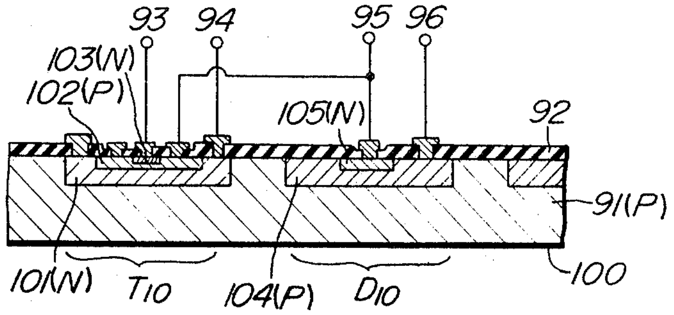

FIGS. 7 and 8 are cross-sectional views showing examples of semiconductor integrated circuit means, which enjoy the advantages brought forth by the application of this invention.

Figure 2:
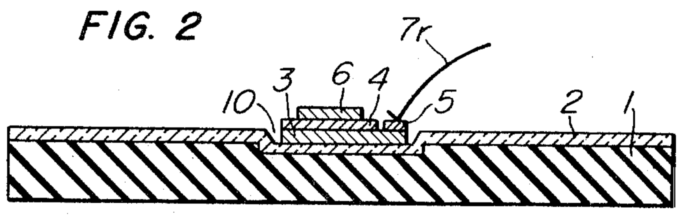
FIG. 2 is a cross-sectional view of the above circuit means along the line II–II of FIG. 1.
Figure 3:
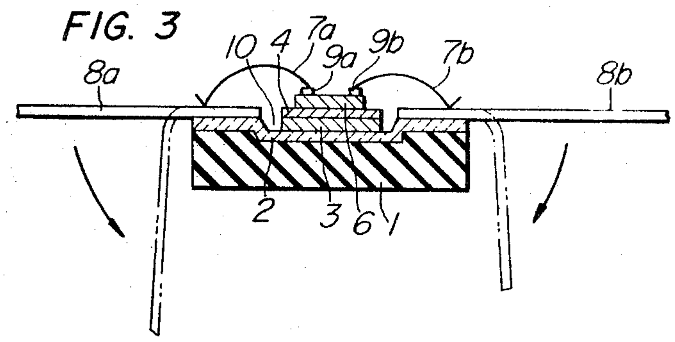
FIG. 3 is a cross-sectional view of the above circuit means along the line III–III.

Explanation of one embodiment of this invention will be made with reference to FIGS. 1 to 3, where a flat package-type semiconductor integrated circuit means is shown. The circuit means comprises an insulating plate 1 having one principal surface on which a glass coating 2 is formed; a metal plate 3 fitted on the glass coating 2 in a cavity 10 formed in said one principal surface; a semiconductor substrate 6 connected to the metal plate 3 through a first metal layer 4 formed on a first portion of the surface of said metal plate 3; a plurality of leadout leads 8 disposed on the glass coating 2 and extending out of the principal surface (particular leads are shown with subscription); a connecting wire **7*r* connecting a second portion of said metal plate to a reference potential terminal or lead 8*r* through a second metal layer 5 formed on the second portion of said metal plate 3; a plurality of electrodes 9 on the substrate 6 for a plurality of circuit elements which are formed in said principal surface of the substrate 6 to form a functional circuit (particular electrodes are shown with subscription); connecting wires 7 connecting said electrodes 9 to said electrodes 8 (particular connecting wires are shown with subscription); and a cap, not shown, fitted on the surface of said insulating plate 1 to seal the substrate 6** tightly.

In the above structure the semiconductor substrate 6 represents such substrates 71 and 91 as shown in FIGS. 7 and 8, where many circuit elements are integrated. The second principal surfaces 83 and 100 having no circuit element and located opposite to the first principal surfaces are made in contact with the first metal layer 4. The surfaces of the second principal surfaces 83 and 100 are connected to the lead **8*r* by way of the first metal layer 4, the metal plate 3, the second metal layer 5, and the connecting wire 7*r*. Practically the leads 8*a* and 8*b*** may be bent downwards as shown by dotted lines in FIG. 3.

The above-mentioned leadout structure possesses the following merit. The N-type substrate 71 of e.g. silicon shown in FIG. 7 whose surface is covered with an insulating film (e.g. silicon oxide) 72 comprises a first MOS (Metal-Oxide-Semiconductor) field effect transistor $T_1$ including a diffused source region of P-type 73, a diffused drain region of P-type 74, a source electrode 77, a gate electrode 78 and a drain electrode 79, and a second MOS field effect transistor $T_2$ including a diffused source region of P-type 75, a diffused drain region of P-type 76, a source electrode 80, a gate electrode 81 and a drain electrode 82. The source electrodes 77 and 80 connect the source regions 73 and 75 to the substrate 71 with short circuits respectively. If the electrode or terminal for substrate 71 is to be fitted to the surface portion by perforating the oxide film 72, then, from a viewpoint of design, it is difficult to make the distances from the substrate electrode to the source electrodes 77 and 80 equal. The difference in distance yields different resistances along the corresponding portions of the substrate. So, the currents in the substrate 71 flowing from each source electrode to the substrate electrode give rise to an electric potential gradient. Although in FIG. 7 only two transistors $T_1$ and $T_2$ are shown for the sake of brevity, occasionally many MOS transistors are employed to form an integrated shift register. In such a case the occurrence of such a potential gradient is unfavorable from an operational point of view as it varies the bias voltage of MOS transistors. On the other hand, in this invention since the distances from the substrate electrode 3 (and 4) mounted on the second principal surface 83 to the source electrodes 77 and 80 are substantially equal, the potential gradient appears scarcely in the substrate 71. Although the same advantage seems to be obtained by directly connecting the wires 7 to each one of the electrodes 77 and 80 and leading them toward the leadout 8, it may not be too much to say that such a method is practically impossible when many MOS transistors are formed in the surface of substrate 71.

Next, explanation will be made of FIG. 8 showing an integrated circuit device realized in the substrate 91. The first principal surface of the P-type substrate 91 of e.g. silicon is covered with a silicon oxide film 92. An NPN bipolar transistor $T_{10}$ comprising an epitaxially grown collector region of N-type 101, a diffused base region of P-type 102 and a diffused emitter region of N-type 103 is formed in the first principal surface. An NP diode $D_{10}$ consisting of an N-type region 105 and a P-type region 104 is also formed electrically and separately from the bipolar transistor $T_{10}$ in the principal surface. The combination of transistor $T_{10}$ and diode $D_{10}$ is utilized for a diode-transistor logic circuit. The second principal surface 100 of substrate 91 is directly or indirectly connected to the metal plate 3 having good thermal conductivity and a relatively large area so that the heat generated in transistor $T_{10}$ and diode $D_{10}$ is more effectively radiated or dissipated compared with the case without such a metal plate 3.

In the above embodiment, for example, the metal plate 3 is made of nickel or Fe-Ni-Co alloy, the first metal layer 4 is of gold or silver, the second metal layer 5 is of aluminum, each of the leads are of Fe-Ni-Co alloy having an aluminum surface layer, and the connecting wire 7 and the electrode 9 are of aluminum. This constitution is suitable if the semiconductor substrate is made of silicon. The surface of the aluminum lead in the portion without connecting wire may, if necessary, be plated with gold. If gold plating is applied to the portion where the connecting wire exists, mechanically fragile Au-Al alloy or compound is formed when gold and aluminum are connected by thermocompression bonding, and unfavorable influences are caused on the reliability of the semiconductor device. It is for this reason that the first gold metal layer and the second aluminum metal layer are formed separately on the metal plate 3. The silicon substrate 6 is connected firmly to the metal plate 3 through the Au-Si eutectic alloy formed by the aid of the first gold metal layer. The aluminum wire 7r connects the aluminum lead 8r to the aluminum layer 5. Thus, a leadout connection not subject to the formation of harmful Au-Al alloy or compound is obtained. It is important in this invention that the gold and aluminum layers 4 and 5 are formed separately on the metal plate 3. It is also recommended for increasing the reliability of the semiconductor device that the aluminum electrode 9 on the substrate 6 is connected to the aluminum lead 8 by the aluminum wire 7.

It is to be noted that the above explanation is merely illustrative. In FIG. 6, for example, if on the metal plate 63 a metal layer 64 is formed with a semiconductor substrate 66 and a gold connecting wire 67r being fitted thereon, the division of the metal layer becomes unnecessary. In this modified embodiment of FIG. 6 the metal layer 63 of e.g. nickel is disposed on the glass layer 62 covering the insulating plate 61, only one metal layer 64 of e.g. gold being placed on the surface of metal plate 63.

Next, a simple method for manufacturing the metal plate utilized for the electrode leadout structure according to the above embodiments will be explained with reference to FIGS. 4a to 4g.

Figure 4A:
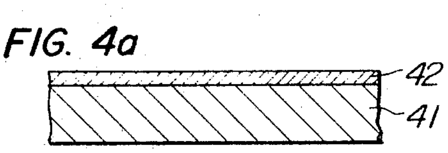
Figure 4B:
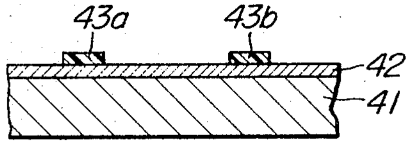
Figure 4C:
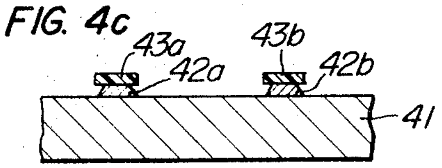
Figure 4D:
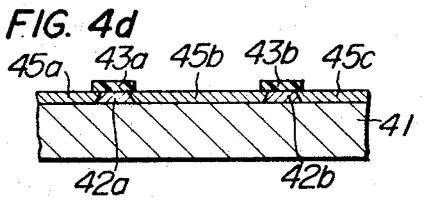
Figure 4E:
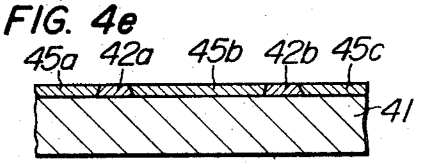
Figure 4F:
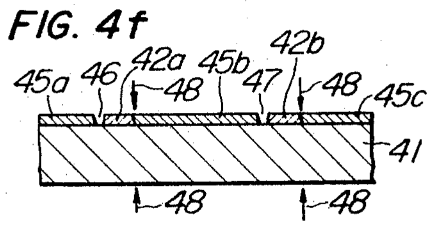
Figure 4G:
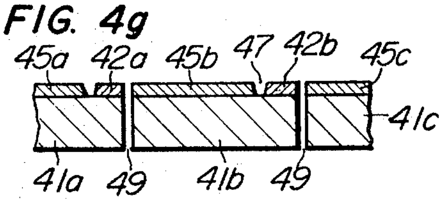

First, as shown in FIG. 4a, a Kovar (trademark of Fe-Ni-Co alloy) plate 41 having an aluminum layer 42 covering the surface thereof is prepared. Photoresist layers 43a and 43b such as KPR (trademark of product manufactured by Kodak Company) are disposed on different portions of the aluminum layer as shown in FIG. 4b. The aluminum layer is selectively photoetched using the photoresist layers 43a and 43b as masks, leaving first and second aluminum layers 42a and 42b on the Kovar plate 41 as shown in FIG. 4c. Next, the Kovar plate is selectively plated with gold with the remaining photoresist layers 43a and 43b as masks, thereby obtaining a Kovar plate 41 having gold layers 45a, 45b and 45c and aluminum layers 42a and 42b coated on the surface, as shown in FIG. 4d. The photoresist layers 43a and 43b are removed (FIG. 4e). Grooves 46 and 47 are formed at the boundaries between the gold layer 45a and the aluminum layer 42a and between the gold layer 45b and the aluminum layer 42b respectively, thereby to separate these layers as shown in FIG. 4f. Finally, the Kovar plate 41 is stamped out by a press along the arrow 48, obtaining a plurality of Kovar plates 41a, 41b and 41c having aluminum and gold layers formed thereon. Of course these Kovar plates may be effectively used as metal plate 3 shown in FIG. 1.

Figure 5A:
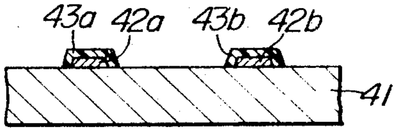
Figure 5B:
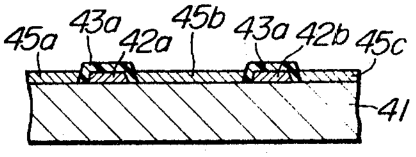
Figure 5C:
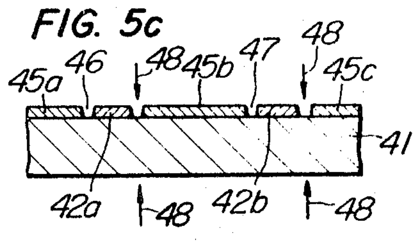

Explanation of a modification of the above manufacturing method will be made with reference to FIGS. 5a to 5c, in which for convenience like reference numerals are used to denote like parts as shown in FIGS. 4a to 4g.

After the step shown in FIG. 4c, the body is heated at from 90° to 120° C. Thus the photoresist layers 43a and 43b are softened so as to cover the side faces of the aluminum layers 42a and 42b as shown in FIG. 5a. Thereafter, as shown in FIG. 5c, gold is deposited by evaporation or plating on the exposed surface of substrate 41 and the photoresist layers 43a and 43b are removed, obtaining a structure as shown in FIG. 5c. The Kovar plate 41 is cut along the arrow 48 and a plurality of separated Kovar plates 41a, and 41b and 41c are obtained in a manner similar to that of the above-mentioned method.

The above metal plate is used as carrier of the semiconductor substrate in the manufacturing steps. The method for obtaining the structure as shown in FIG. 2 is as follows. First, a silicon substrate 6 is disposed on the gold layer 4 on a heated metal plate 3. An Au-Si eutectic layer is formed between the gold layer 4 and the silicon substrate 6 so that the substrate 6 is firmly bonded on the metal plate 3. The metal supporting plate 3 fitted with the semiconductor substrate 6 is placed in a cavity 10 in a heated insulating supporting plate 1 and bonded firmly to the supporting plate 1 with a fused glass layer 2. Connecting wires 7 are connected to the prescribed portions, as shown in FIG. 1. Next, a cover of insulating material meeting the cavity 10 and having an area large enough to accommodate the metal layer 3 and the semiconductor substrate 6 is placed and fused on the support plate 1. Thus, the semiconductor substrate 6 can be sealed in the insulating vessel.

The above explanation has been made only of a few embodiments of this invention which of course will not be restricted thereto. Minute modifications of this invention may be done easily by those skilled in the art within the scope of the appended claims.

I claim:

1. A semiconductor device comprising:

a. an insulating plate having a cavity in one principal surface thereof;

b. a plurality of leadout leads disposed on said principal surface and extending out of said principal surface of said insulating plate;

c. a metal plate placed in said cavity, said metal plate and leadout leads being separately disposed on said insulating plate, said metal plate having a principal surface opposite said one principal surface of said insulating plate;

d. first and second metal layers covering first and second portions of said principal surface of said metal plate, said first and second metal layers consisting essentially of gold and aluminum, respectively;

e. a semiconductor substrate having a first and a second opposing principal surface, at least one circuit element formed in said first principal surface of said substrate, and a plurality of individual metal electrodes connected to said circuit element, said second principal surface of said substrate being disposed on and connected to said first metal layer;

f. a first connecting wire electrically connecting said second metal layer to one of said leads; and g. second connecting wires electrically connecting said individual metal electrodes to the corresponding remaining leads.

2. A semiconductor device according to claim 1, wherein said principal surface of said insulating plate and the surface of said plate in said cavity are covered with a glass layer and said leads and said metal plate are connected to said insulating plate through said glass layer.

3. A semiconductor device according to claim 1, wherein said semiconductor substrate is made of silicon, and said first and second connecting wires consist essentially of aluminum.

4. A semiconductor device comprising:

a. an insulating plate having one principal surface;
b. a glass layer having a low melting point formed on at least one portion of said principal surface;
c. a plurality of leadout leads disposed on said glass layer and extending out of said principal surface of said insulating plate;
d. a metal plate disposed on the surface of said glass layer and separated from said leadout leads;
e. a first metal layer selected from the group consisting of gold and silver formed on a first portion of the surface of said metal plate;
f. a semiconductor substrate having a first and a second principal opposing surface, a plurality of circuit elements formed in said first principal surface and a plurality of metal electrodes connected to the circuit elements, said second principal surface of said substrate being connected to said metal plate through said first metal layer;
g. a second metal layer consisting essentially of aluminum formed on a second portion of the surface of said metal plate different from said first portion;
h. a first connecting wire consisting essentially of aluminum connecting said second metal layer to at least one of said leads; and
i. a plurality of second connecting wires consisting essentially of aluminum connecting said electrodes to the corresponding remaining leads.

5. A semiconductor device according to claim 4, wherein at least the portions of said leads to which said connecting wires are connected are covered with aluminum layers, whereby said first and second connecting wires are connected to said leads through said aluminum layers.